(12) United States Patent
Chen et al.

(10) Patent No.: US 8,943,445 B2
(45) Date of Patent: Jan. 27, 2015

(54) METHOD OF MERGING COLOR SETS OF LAYOUT

(71) Applicant: Taiwan Semiconductor Manufacturing Company, Ltd., Hsinchu (TW)

(72) Inventors: Pi-Tsung Chen, Zhubei (TW); Ming-Hui Chih, Luzhou (TW); Ken-Hsien Hsieh, Taipei (TW); Wei-Long Wang, Hsinchu (TW); Wen-Chun Huang, Xi-Gang Village (TW); Ru-Gun Liu, Hsinchu (TW); Tsai-Sheng Gau, Hsinchu (TW); Wen-Ju Yang, Hsinchu (TW); Gwan Sin Chang, Hsinchu (TW); Yung-Sung Yen, Taipei County (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/104,279

(22) Filed: Dec. 12, 2013

(65) Prior Publication Data

US 2014/0101623 A1 Apr. 10, 2014

Related U.S. Application Data

(62) Division of application No. 12/702,591, filed on Feb. 9, 2010, now Pat. No. 8,631,379.

(51) Int. Cl.
*G06F 17/50* (2006.01)
(52) U.S. Cl.
CPC .................. *G06F 17/5081* (2013.01)
USPC ................ 716/55; 718/55; 718/132; 718/139

(58) Field of Classification Search
CPC .......... G06F 17/50; G06F 15/04; G06F 9/455
USPC ............................................ 716/55, 132, 139
See application file for complete search history.

(56) References Cited

U.S. PATENT DOCUMENTS 6,787,469 B2    9/2004  Houston et al.
7,546,602 B2 *  6/2009  Hejlsberg et al. ............. 719/313
(Continued)

OTHER PUBLICATIONS

Office Action from corresponding application No. CN201010546487.5.

(Continued)

*Primary Examiner* — Thuan Do
(74) *Attorney, Agent, or Firm* — Lowe Hauptman & Ham, LLP

(57) ABSTRACT

A method includes determining one or more potential merges corresponding to a color set $A_i$ and a color set $A_j$ of N color sets, represented by $A_1$ to $A_N$, used in coloring polygons of a layout of an integrated circuit. N is a positive integer, i and j are integers from 1 to N, and i≠j. One or more potential cuts corresponding to the color set $A_i$ and the second color set $A_j$ are determined. An index $A_{ij}$ is determined according to the one or more potential merges and the one or more potential cuts. A plurality of parameters F related to the index $A_{ij}$ is obtained based on various values of indices $f_i$ and $f_j$. A parameter F is selected among the plurality of parameters F based on a definition of the index $A_{ij}$.

20 Claims, 12 Drawing Sheets

(56) References Cited

U.S. PATENT DOCUMENTS

| | | | |
|---|---|---|---|
| 7,831,942 | B1 | 11/2010 | Gennari et al. |
| 2008/0037861 | A1 | 2/2008 | Nikolsky |
| 2010/0023914 | A1 | 1/2010 | Sahouria et al. |
| 2010/0153905 | A1 | 6/2010 | Maeda |

OTHER PUBLICATIONS

Gensheng, Gao et al., "A Phase-Compatibility Rule Checker for Standard Cell Layout Designed with Alternating PSM", May 31, 2004, The Chinese Institute of Electronics, 6 pages.

Tritchkov, Alexander, et al., "Double-Patterning Decomposition, Design Compliance, and Verification Algorithms at 32nm hp", Photomask Technology 2008, edited by Hiroichi Kawahira, Larry S. Zurbrick, Proc. of SPIE vol. 7122; pp. 71220S-1-71220S-15.

Kahng, Andrew B, et al., "Layout Decomposition for Double Patterning Lithography", ICCAD '08, Nov. 10-13, 2008, San Jose, CA; IEEE, Aug. 12, 2010.

http://en.wikipedia.org/wiki/Breadth-first_search, Breadth-first search—Wikipedia, the free encyclopedia, Aug. 20, 2010, pp. 1-4.

* cited by examiner

METHOD OF MERGING COLOR SETS OF LAYOUT

PRIORITY CLAIM

The present application is a divisional of U.S. application Ser. No. 12/702,591, filed Feb. 9, 2010, which is incorporated by reference herein in its entirety.

TECHNICAL FIELD

Embodiments of the invention are generally related to integrated circuit layouts. In various embodiments, mechanisms are provided to enable layouts meeting the double patterning technology requirements including splitting the layouts into different masks.

BACKGROUND

Integrated circuit layouts cannot be split into two masks if they include conflict cycles. A conflict cycle may be referred to as an odd cycle because it is a cycle in the conflict graph that contains an odd number of edges. Many layout designers (e.g., customers of a semiconductor foundry) do not have tools to check those conflict cycles and thus can violate the rules to split the layouts. Various layout approaches cannot fix an odd cycle and associated problems because of the constraint on the stitch locations. A straightforward method is to split the patterns, connect the polygons by stitch areas, and use a matrix global solver to decompose the layout. In that method, however, memory consumption is huge; cycle time increases; customer generally is not involved in the layout creation process; and the layout creation process is not user-friendly because different approaches are employed to decompose the layout when the polygons are cut and not cut.

BRIEF DESCRIPTION OF THE DRAWINGS

The details of one or more embodiments of the invention are set forth in the accompanying drawings and the description below. Other features and advantages of the invention will be apparent from the description, drawings, and claims.

Like reference symbols in the various drawings indicate like elements.

DETAILED DESCRIPTION

Figure 1:
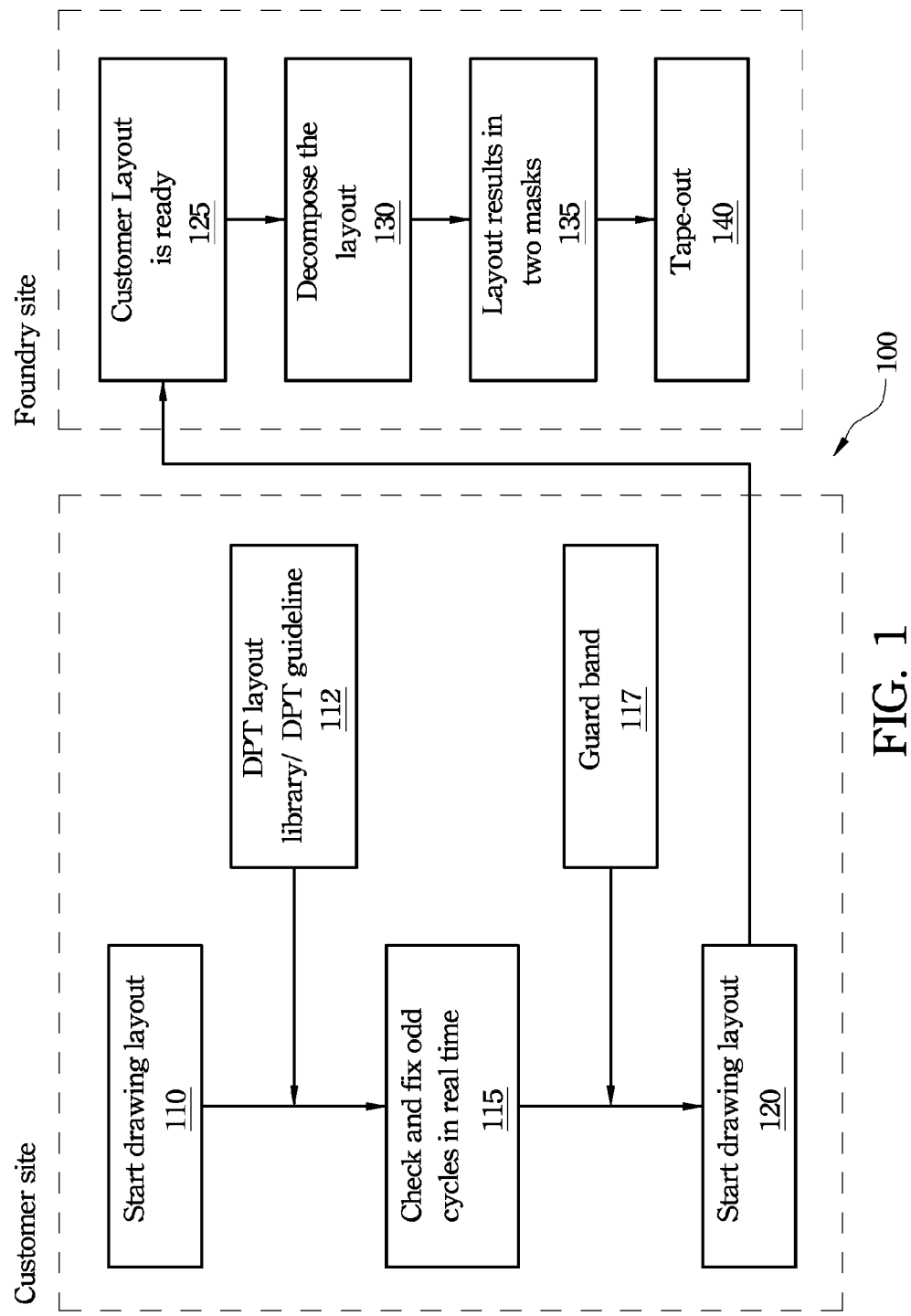
FIG. 1 shows a flowchart illustrating a method to generate a layout and split it into two masks, in accordance with an embodiment of the invention.

Embodiments, or examples, of the invention illustrated in the drawings are now being described using specific language. It will nevertheless be understood that no limitation of the scope of the invention is thereby intended. Any alterations and modifications in the described embodiments, and any further applications of principles of the invention described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

Exemplary Method Embodiment to Decompose a Layout

FIG. 1 shows a flowchart illustrating a method embodiment decomposing an integrated circuit layout into two masks. In this illustration, the foundry provides a solution for customers to make sure the layout can be split into two masks, e.g., a mask A and a mask B. Further, the customer (e.g., a customer layout designer) generates a first part of the layout at the customer site (e.g., blocks 110 to 120) while the foundry (e.g., a foundry layout designer) generates a second part of the layout at the foundry site (e.g., blocks 125 to 140). Additionally, the foundry previously provided the double patterning technology (DPT) library, the DPT guidelines, the conflict checker, and the guard band or boxing guidelines to the customer so that these tools are available to be used in generating the layout.

In block 110 the customer starts generating a layout. In block 112 a DPT library and/or DPT guidelines are available to help avoiding conflict cycles (e.g., odd cycles) so that the finalized layout may be split-able into two masks. Generally, the library includes exemplary layouts that have been verified to be split-able and may be used during layout. The library also includes layouts that violate the layout split rules to be avoided.

In block 115 the customer uses a real-time odd cycle checker and fixer previously provided to check and, if appropriate, fix the odd cycles. Depending on implementations, in some embodiments, the checker and the fixer may be two distinct or integrated packages of software. Alternatively, the fixer may be part of the checker.

In block 117, to reduce memory usage, the customer may "guard band" or "box" the devices, i.e., keeping layouts of individual devices or smaller groups of devices in layout units so that these layout units, rather than the layout of a whole application circuit, may be checked against conflicts. In an embodiment, if guard band or box is used, the information is saved (e.g., the layouts or guard bands are marked with layer numbers) and can be used later. For example, the decomposer in block 130 reads the layer numbers and acts accordingly.

In block 120 the customer finishes the layout at the customer site.

In block 125 the customer layout is ready for decomposition at the foundry site.

In block 130 the foundry uses a layout decomposition tool to decompose the layout, e.g., split it into two masks.

In block 135, the layout results in two masks, e.g., mask A and mask B.

In block 140, the layout including the two masks A and B, is used in taping-out.

Library and Guidelines to Avoid Conflict Cycles

Figure 2:
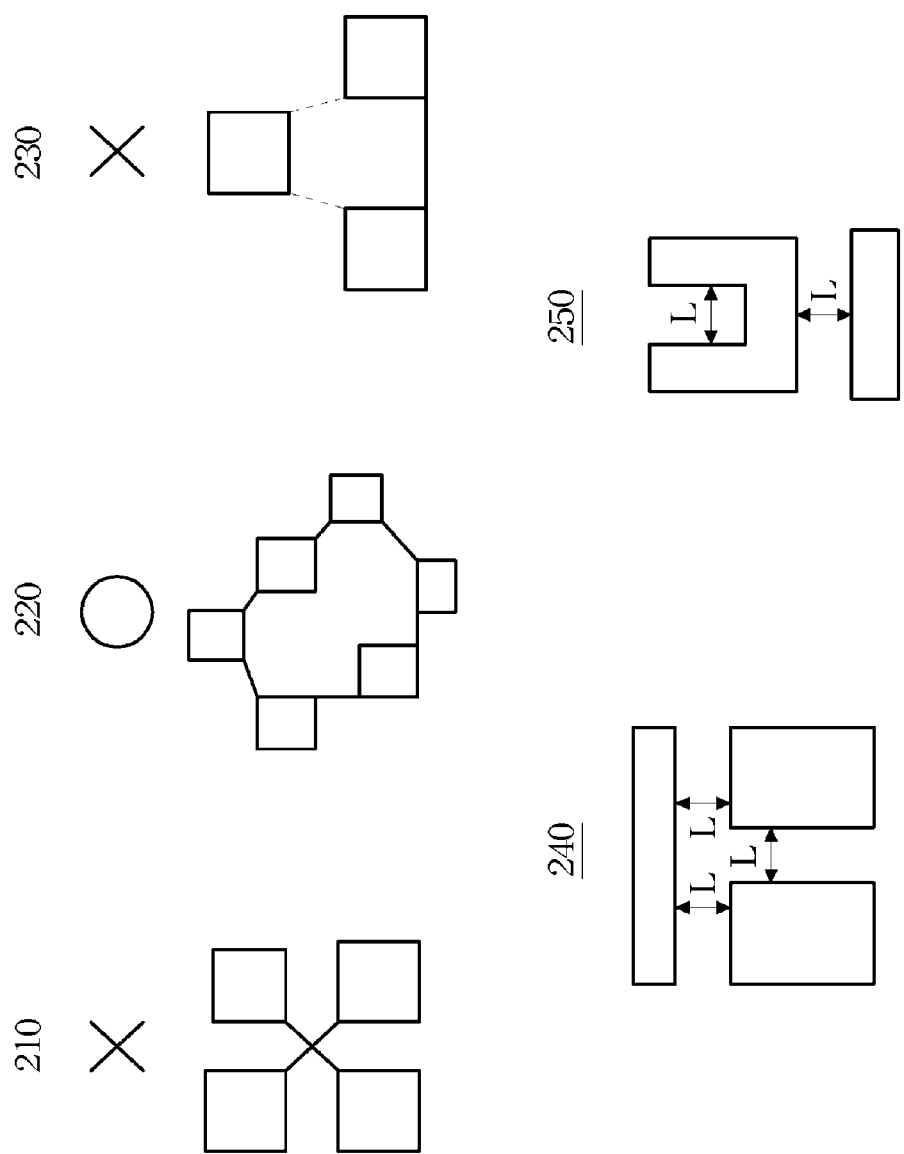
FIG. 2 shows exemplary layouts that have been verified to be split-able and thus layout conflicts can be avoided, in accordance with an embodiment.

FIG. 2 shows exemplary layouts in a layout library. These layouts include layouts that have been verified to be split-able and thus may be used in generating a layout for a particular application/circuit, and layouts that can cause conflicts, e.g., not split-able, to be avoided. For example, layout 210 is not split-able because there are six conflict edges resulting from the triangle inequality of the 2 conflict edges shown. Layout 220 is split-able because, even though a loop exists, the cycle is even (e.g., the number of conflict edges is six). Layout 230 is not split-able because a loop exists and the number of conflict edges or the conflict cycle is odd (e.g., the number of conflict edges is three). Both layouts 240 and 250 show a distance L at different locations, and the layout should not be used if a distance L at a particular location is less than a predetermined value (e.g., 20 nm, 30 nm, 40 nm, etc., depending on technologies) and polygon cutting is not allowable because without polygon cutting, the layout is not split-able. Self-conflict layout (e.g., the U shape pattern in layout 250) is also not split-able if polygon cutting is not allowable. In situations where polygon cutting is allowable and the conflict can be resolved, layouts 240 and 250 may be used. The separation space between two polygons varies for different technologies and may be different at different locations, including, for example, separation space between end-end, end-run, corner-corner, etc. Depending on applications the library may be integrated into the software package (e.g., the checker, the decomposer, etc.) and/or accessible during layout generation.

Check and Fix Conflict Cycles in Real-Time

Figure 3:
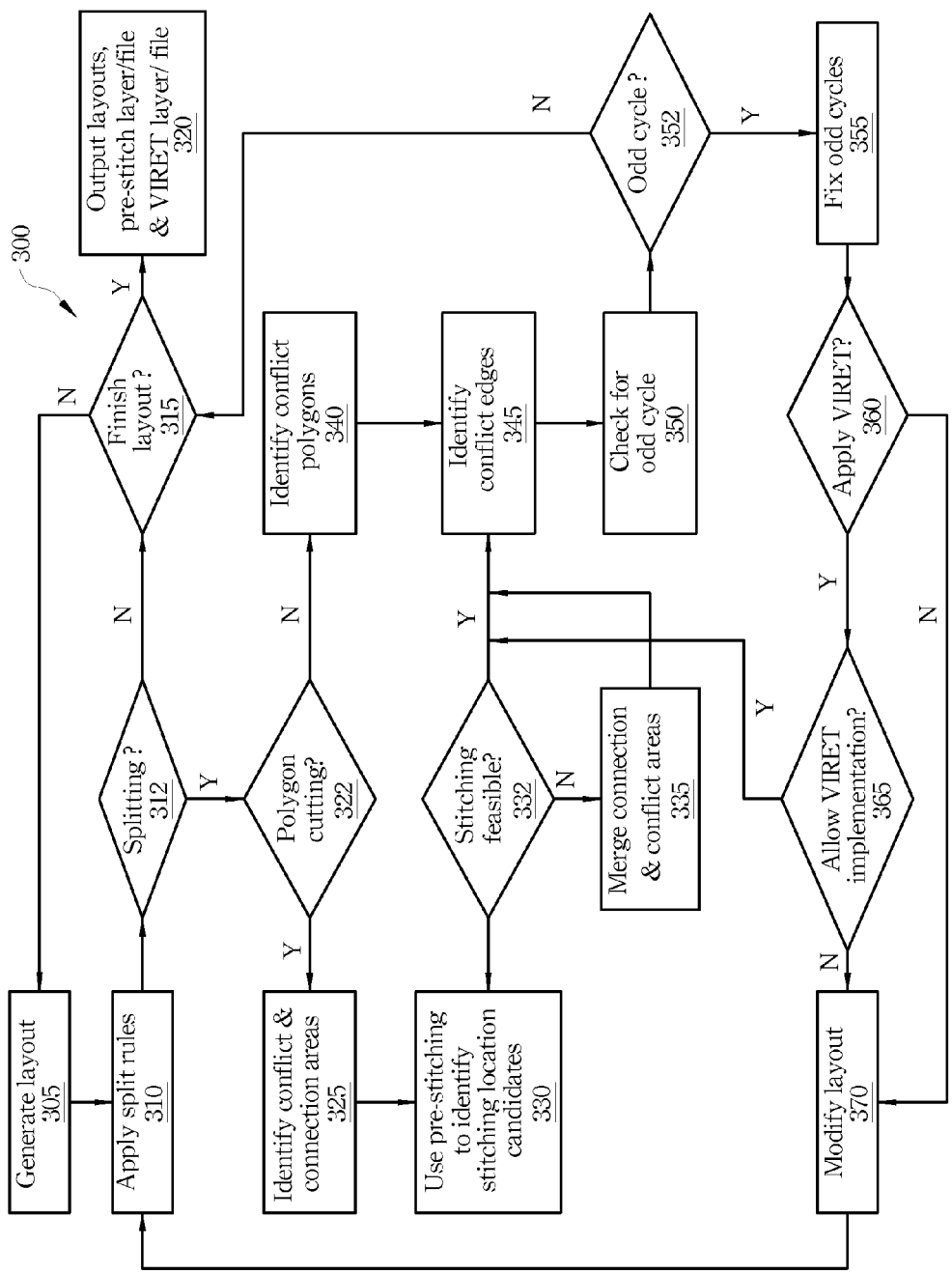
FIG. 3 shows a flowchart illustrating a method to generate a layout and check for odd cycles in real-time, in accordance with an embodiment.

FIG. 3 shows a flowchart 300 illustrating a method embodiment for checking a conflict cycle in real time, e.g., block 115 in FIG. 1. In an embodiment, while the layout is generated, a checker software tool (e.g., the "checker") in real time identifies the conflict polygons, the conflict areas, the conflict edges, the odd cycles, etc., if they arise. For example, the checker provides an arrow (e.g., a red arrow) between two conflict areas or polygons when the separation space between two polygons is smaller than a required or predetermined space. When the conflict edges form a loop, the checker counts the number of edges and highlights the edges if they are odd, i.e., they form an odd and thus conflict cycle.

In block 305 the layout designer generates (e.g., draws) a layout corresponding to a circuit, a system, an application, etc. During layout generation polygons representing circuits (e.g., sub circuits) are formed.

In block 310 the checker applies the split rules against the layout being generated. In an embodiment, rules regarding layout split were previously provided to the checker. Generally, the checker determines if splitting is specified by the designer and/or required (e.g., to meet some specifications). Depending on applications a layout is to be split if the space between two polygons is too small, e.g., less than a predetermined value. Further, the predetermined space may be defined by the distance between the edges or the center of the polygons, which may be referred to as a pitch. When splitting is specified and/or required (and if the splitting is allowed), the checker determines if the layout is split-able. In an embodiment, a layout is split-able into two masks if there is no odd cycle in the layout. Further, during layout generation, if the designer forms an odd cycle, the checker provides indications that an odd cycle was formed.

In block 312, the checker determines whether splitting is necessary when there is a conflict edge. If splitting is not necessary, the checker in block 315 determines whether the designer finishes drawing the layout. If the designer finishes drawing the layout, the checker in block 320 provides the output layout. During layout generation, if pre-stitching was performed (e.g., in block 330), the checker in block 320 saves the location of the pre-stitching areas to a file or one or more layers and makes them available as appropriate.

If in block 315, the designer has not finished with the layout, the designer continues generating the layout. That is, the method embodiment flows to block 305, and the designer continues drawing the layout going through the flow of flowchart 300.

In block 322, the checker determines if polygon cutting is allowed. In an embodiment, the designer, through an input mechanism (e.g., a programming parameter, a graphic user interface, etc.), specifies if polygon cutting is allowed. Depending on applications, the checker may query whether the designer wanted polygon cutting or not, and the designer may respond through such a mechanism.

If polygon cutting is not necessary for the layout to be split-able, the checker in block 340 identifies conflict polygons, and, in block 345, identifies conflict edges. In block 350, the checker checks for odd cycles.

In block 352 the checker determines if there is any odd cycle in the layout, and if there is not any odd cycle, the method embodiment flows to block 315 and continues therefrom.

If in block 352, the checker determines an odd cycle exists, the checker in block 355 attempts to fix the odd cycle. Depending on applications, the checker may invoke an odd cycle fixer, which could be part of the checker, a package of software integrated into the checker, or an independent package of software, etc.

In block 360, the checker determines if vertical integrated resolution enhancement technology (VIRET) could be used. VIRET, in an embodiment, is a software package to enlarge the margin of the stitching area. Those skilled in the art will recognize that when a margin of a stitching area is enlarged, the corresponding conflict edge, conflict polygon and thus odd cycle may be resolved. In an embodiment this information is saved to a file or layers.

In block 365, the checker determines whether the designer wanted to use VIRET. In many situations, the design may seek to not use VIRET, e.g., not to enlarge the margin for the stitching area. If VIRET is used, e.g., after the margin has been enlarged, the checker (re)-identifies the conflict edges, and the method flows to block 345 and continues therefrom.

If in block 365, the checker determines that VIRET is not used, the method flow proceeds to block 370 where the designer modifies his/her layout. Once the layout is modified, the method embodiment flows to block 310 and continues therefrom.

In block 322, however, if the checker determines if the polygon cutting is allowed, then the checker, in block 325, based on the polygons having been created, identifies the conflict and connection areas.

In block 330, the checker performs pre-stitching to identify location candidates for stitching. Here, like other functions, the checker may or may not include internal pre-stitching capabilities. In any event, the checker may invoke some pattern matching or recognition software package to identify the pre-stitching locations.

In block 332 the checker, based on the pre-stitching information, determines whether a location is feasible for stitching. If stitching is feasible, the checker identifies the conflict edges in block 345, and the method flows continues therefrom. If stitching is not feasible in block 332, then the checker in block 335 removes the corresponding stitching location candidate. In effect, the checker merges the polygon portions separated by this stitching location candidate and thus reforms a conflict area if appropriate. The method flows to and continues from block 345.

FIG. 3 is illustrated in the context of using the conflict checker in real-time. That is, the checker is functioning while a layout designer is drawing the layout. In this aspect many conflict check rules (e.g., the minimum space requirement between two polygons, the odd cycle violations, etc.) are applied, and the conflicts (e.g., conflict edges, conflict polygons, odd cycles, etc.) are displayed graphically in real time. In some embodiments, a "button click" approach is adopted to determine if an existing layout is split-able or needs modification. For example, an input layout (e.g., a layout that was previously drawn) is provided as an input to the checker, and appropriate parameters are set so that the method embodiment may flow as desire, and if an odd cycle exists in the input layout, the checker can provide a message indicating modification to the layout is needed. In this example, the method embodiment flows through blocks 305, 310, 312, 322, 325, 330, 332, 335, 345, 350, 352, 355, 360, 365, and 370. In this flow, the parameters corresponding to splitting (e.g., block 312), polygon cutting (e.g., block 322), applying VIRET (e.g., block 360) are set to yes (Y), yes (Y), and no (N), respectively. Further, the checker recognizes pre-stitching is feasible (e.g., block 332) and an odd cycle (e.g., block 352) is detected. For another flow, appropriate parameters are set accordingly.

Pre-Stitching

Figure 4:
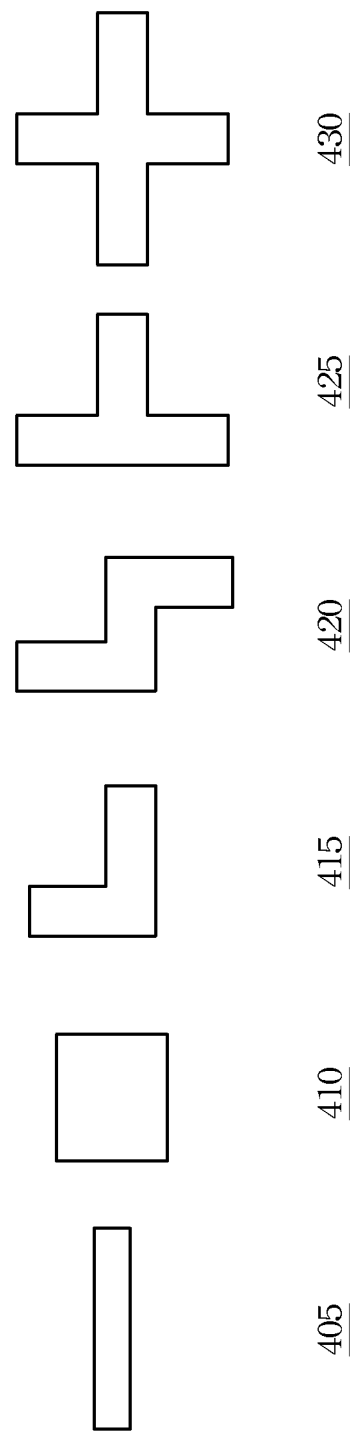
FIG. 4 shows exemplary stitching elements in accordance with an embodiment.

Pre-stitching (e.g., block 330) identifies candidate locations for stitching. Pre-stitching checks to determine if a stitching element fits in a connection area. FIG. 4 shows exemplary stitching elements including a bar 405, a square 410, an L-shape 415, a Z shape 420, a T-shape 425, and a cross-shape 430. Stitching elements in FIG. 4 are for illustration, embodiments of the invention are not limited to those elements, but are applicable to other stitching elements of different shapes and sizes including, for example, composites and combinations of the shapes shown in FIG. 4. Further, orientation of a stitching element could be any angle. Pre-stitching locations may or may not be the final stitching locations. Pre-stitching locations may be user-defined and/or determined by available software that uses pattern matching to match the stitching elements (e.g., those in FIG. 4) to the patterns in the connection areas potentially available for stitching. Depending on applications, the software may move the stitching elements (e.g., up, down, right, left, etc.) to pattern match. Generally, when a connection area and a stitching element have the same shape, a location is selected for stitching if the stitching element is smaller than the connection area. Based on the potential stitching locations, embodiments of the invention can resolve odd cycles. In some embodiments, the disclosed method is advantageous over other approaches that use pre-cutting because, depending on applications, pre-cutting can still result in odd cycles, while pre-stitching in various embodiments of the invention can help resolve the odd cycles. For example, when stitching is feasible, embodiments can reduce the number of conflict edges or remove a cycle, and thus resolve the odd cycle (e.g., changing from an odd cycle to an even cycle or to a non-cycle).

Figure 5:
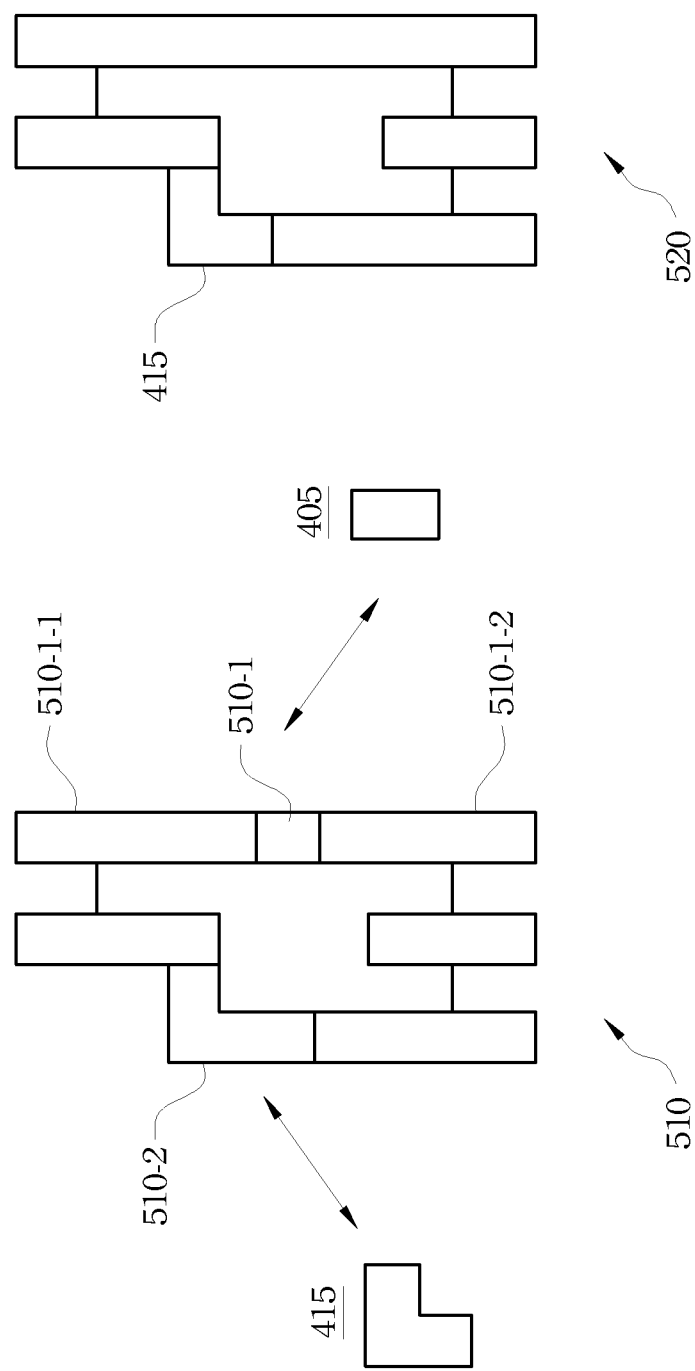
FIG. 5 shows diagrams illustrating pre-stitching, in accordance with an embodiment.

In various embodiments of the invention, when a stitching location candidate is not feasible for stitching (non-stitching location), the checker removes that non-stitching location. In effect, the checker merges the portions of the polygons separated by the non-stitching location. FIG. 5 shows diagrams illustrating pre-stitching in accordance with an embodiment. In diagram 510, two exemplary conflict areas 510-1-1 and 510-1-2 are shown, two connection areas (e.g., locations) 510-1 and 510-2 have been identified, and two stitching elements 405 and 415 (e.g., based on pattern matching or recognition) are used to compare against locations 510-1 and 510-2 respectively. For further illustration purposes, stitching element 405 does not fit in area 510-1 while stitching element 415 fits in area 510-2. As a result, location 510-2 is identified as a stitching location candidate, and the size of stitching element 415 is used for stitching. In contrast, area 510-1 is not considered a stitching location candidate, and, consequently, embodiments of the invention remove the connection area 510-1 or merge the polygons 510-1-1 and 510-1-2. Diagram 520 illustrates the result of pre-stitching diagram 510, showing stitching element at location 510-2 as a stitching location candidate and conflict areas 510-1-1 and 510-1-2 have been merged once location 510-1 is no longer a stitching location candidate. Further, diagram 520 does not include an odd cycle as compared to diagram 510 that includes an odd cycle if polygon cutting is not allowable.

Fixer

Some embodiments of the invention provide fixing guidelines that include enlarging space between polygons and/or apply VIRET (vertical integrated resolution enhancement technology) solution to extend the stitching area margin so that the stitching area is as small as possible. Once the margin is extended (e.g., enlarged), the conflict space is resolved. Depending on situations, the space between two conflict polygons still may not meet the minimum space requirement but is allowed if VIRET is used. As a result, the odd cycle is resolved. In various embodiments, VIRET is applicable for metal layers, and VIRET takes two or more input layers. Actually, VIRET can be viewed as another stitching but is generated at another layer (e.g., a via layer). Further, if there are final contours in the masks that can cause bridging and necking risks (e.g., hot spots), VIRET may be used or designers have to pull back the line-end (e.g., the space is enlarged) and thus reduces this risk, but the cell size may increase. In an embodiment, where there are a primary mask and a secondary mask, a dummy via having a corresponding pattern or a pattern modified from the original pattern is put at a via layer to provide enough coverage for each mask such that after the Dual Damascene process the dummy via can link the two metal lines. The minimum area of coverage or overlap between the dummy or the modified pattern and the metal pattern in each mask depends on process capability and/or circuit performance, but the pattern modification is subject to the design rules for the particular technology (e.g., process).

Guard Band or Boxing

Figure 6:
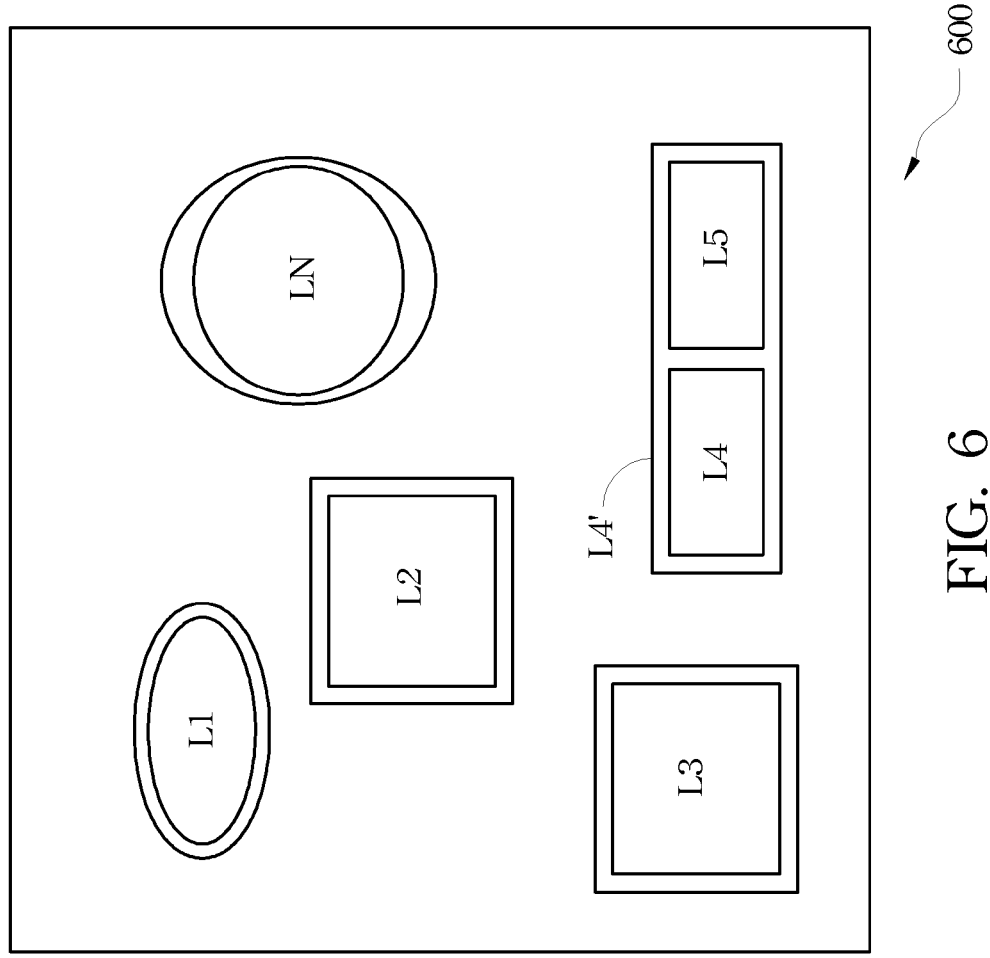
FIG. 6 shows a diagram illustrating guard banding or boxing in accordance with an embodiment.

Some embodiments of the invention provide guard bands or boxes to reduce memory usage when running a software package (e.g., the conflict checker, the fixer, the decomposer etc.). These embodiments limit the size of a layout for a particular application, circuit, etc., to some smaller layout units so that each layout unit or a combination of smaller layout units, rather than the layout for a whole circuit application, may be run with a software package. Using a smaller or a group of fewer layout units tremendously reduces memory usage. For example, without guard banding, e.g., using the whole layout for a particular circuit application, the coloring software colors all polygons at the same time in which the memory usage for the system running the software package is invoked for the whole circuit application size. In some situation where the layout for the whole circuit application is used, memory may take up to 30 Gb. In contrast, with guard banding, e.g., using a smaller layout unit, the coloring software colors polygons for that smaller layout unit, and the memory size is invoked only for that particular smaller layout unit. The size of a layout unit varies and depends on design choices by the layout engineer. For example, the engineer may choose a layout unit to include an independent circuit with a particular function (e.g., processing, storage, input-output, etc.), or circuits with interrelated functions (e.g., storage and input-output, processing and storage, processing and input-output, etc.), circuits that do not require splitting of the layout, etc. In some embodiments, the designer may select an arbitrary size of a layout unit for a particular memory availability of the system running the software. FIG. 6 shows a layout 600 illustrating guard banding or boxing in accordance with an embodiment. FIG. 6 shows that a particular layout 600 includes individual layout units L (e.g., L1, L2, L3, . . . LN) wherein, in some embodiments each layout unit L1, L2, L3, . . . LN, etc., is of different shapes and sizes. Further, a layout unit (e.g., layout unit L4') may include more than one other layout unit including layout units L4 and L5, etc. In an embodiment, the customer saves the guard band information after checking/fixing conflict cycles (e.g., in block 115) and the decomposer in block 130 uses this information to save memory usage. For example, the decomposer based on the layer numbers of each layout unit or guard bands, separates this unit from other units. Further, when coloring is invoked the coloring tool (e.g., software) colors layout units that have the same layer numbers at a time or that are enclosed by the same guard band.

Layout Decomposition

Figure 7:
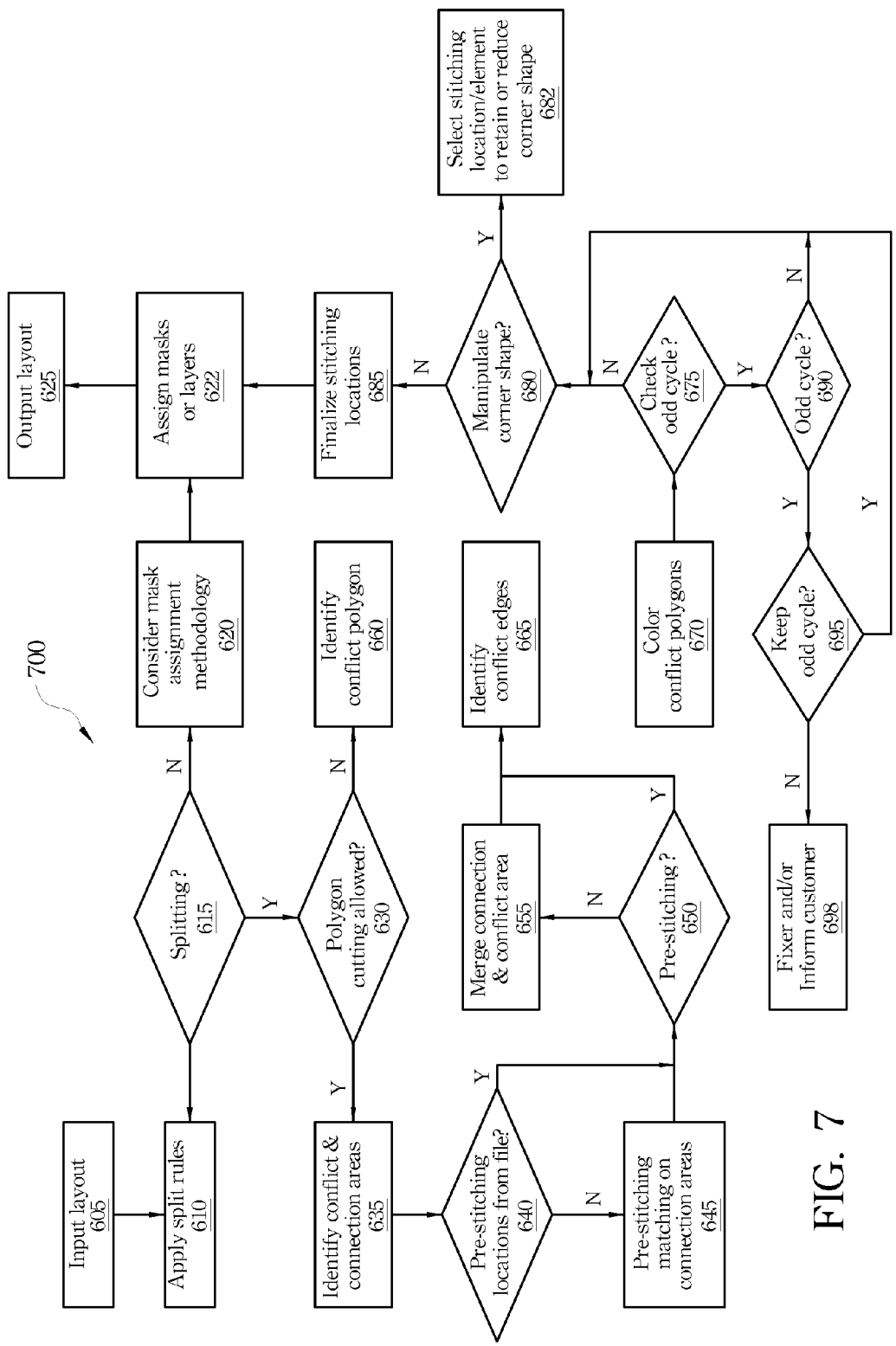
FIG. 7 shows a flowchart illustrating a method to decompose a layout that was previously created.

FIG. 7 shows a flow chart 700 illustrating a method embodiment for decomposing a layout (e.g., block 130 in FIG. 1). In this illustration, the customer provided a layout to be decomposed by the foundry. For further illustration, the layout has been verified to be split-able in accordance with techniques described in this document.

In block 605 the layout provided by the customer is used as input to the layout decomposition software (e.g., the decomposer). The layout, in an embodiment, is in a database file format, e.g., Graphic Data System (GDS II), Open Artwork System Interchange Standard (OASIS), etc.

In block 610 the decomposer applies the layout split rules against the input layout. In block 615 the decomposer determines whether splitting is necessary. If splitting is not necessary then the decomposer in block 620 considers various methodologies to assign the masks, including, random assignment, model-based-assignment, etc.

In block 622, the decomposer assigns layout masks to each polygon. Since a mask corresponds to a layout (e.g., different mask, different layer), this step may be referred to as assigning layers. In block 625 the decomposer provides the output layout or tape-out.

In block 615, if, however, splitting is necessary, the decomposer, in block 630, determines whether polygon cutting is allowed. If polygon cutting is not allowed, then the decomposer in block 660 identifies the conflict polygons and in block 665 identifies conflict edges and continues from this block 665 as explained below.

If, however, polygon cutting is necessary and allowed in block 630, the decomposer in block 635 identifies conflict and connection areas.

In block 640, the decomposer determines if stitching locations are available (e.g., previously saved to a file or layers of output layout in block 320 through pre-stitching or VIRET). If such stitching locations are not available, then the decomposer in block 645 performs pre-stitching on connection areas. If, however, pre-stitching locations were previously saved to a file and are now available to the decomposer, the decomposer uses those locations and in block 650 determines if pre-stitching of a location is feasible. If in block 650 pre-stitching is not feasible, then the decomposer in block 655 merges connection areas separated by the potential stitching location but stitching is found not to be feasible.

The decomposer in block 665 identifies conflict edges and in block 670 colors conflict polygons/areas.

The decomposer in block 675 determines if odd cycles should be checked. If there is no need to check odd cycles then the decomposer in block 680 determines if manipulating the corner shape (e.g., the right angle in a mask) is necessary and/or desirable. If manipulating the corner shape is necessary and/or desirable, the decomposer in block 682 analyzes the pre-decomposed masks and/or the contours to select a stitching location based on a stitching element that will reduce or retain the corner shapes compared to the original layout without decomposition. In an embodiment, the decomposer identifies and/or marks the corner location of the pre-decomposed layout using geometry recognition from a software package and selects an appropriate size and shape of a stitch element. The decomposer then generates the pre-decomposed mask/layout patterns, checks the corner number and locations of the pre-decomposed patterns, and compares these patterns with the original layout. The decomposer finally optimizes (e.g., reduces/increases) the size of the stitch element based on user requirements that may retain or reduce the number of corner shapes. In various embodiments of the invention, FEOL (front-end of line) generally uses less corner roundings (e.g., curve in a wafer) and thus reduces them accordingly. In contrast, BEOL (back-end of line) uses more corner roundings, and retains them as appropriate.

If there is no need to manipulate the corner shape then in block 685 the decomposer finalizes the stitching locations, e.g., taking account of location candidates that have been removed, etc., and the method flows to blocks 622 and 625 to assign the masks and output the layout.

If, in block 675 however, the decomposer determines that odd cycle should be checked, then the decomposer in block 690 determines if the there is any odd cycle in the layout. If there is not any odd cycle in the layout, then the method flows to block 680 and continues therefrom as explained above. If, however, there is any odd cycle, then the decomposer in block 695 determines if it is acceptable to keep the odd cycle. If it is acceptable to keep the odd cycle then the method flows to block 680 and continues as above.

If in block 695, however, the decomposer determines it is not acceptable to keep the odd cycle then the decomposer in block 698 invokes the fixer to fix the odd cycle. Alternatively or in addition to fixing the odd cycle, the decomposer issues a message to inform the customer that there is an odd cycle in the layout provided by the customer.

Coloring Conflict Polygons/Areas

Double patterning is a method for decomposing a layout so that sub-resolution configurations are split into two distinct masks. The layout in such situations may be referred to as 2-colorable or bipartite. According to graphic theory, a graph is bipartite or 2-colorable if and only if it does not contain an odd cycle (e.g., odd number or vertices or edges). A cycle graph is a graph that consists of a single cycle, or the number of vertices is connected in a closed chain. In various embodiments of the invention a conflict edge connects a conflict polygon in a first mask (e.g., mask A) to another conflict polygon in a second mask (e.g., mask B). Embodiments then color those two conflict polygons using a breath-first search (BFS), a graphic search, or a coloring software tool that can recognize an odd cycle, if it exists. In situations where polygon cutting is necessary and/or desirable to resolve odd cycles, various embodiments of the invention use pattern matching or recognition to identify locations candidates for stitching and thus conflict areas (or conflict cycles). Embodiments then imitate the 2-coloring method to check for odd cycles. As a result, embodiments are advantageous over other approaches that cannot check for odd cycles before splitting the mask.

Merging and Stitch Optimization

In various embodiments of the invention, coloring provides information for stitches to be merged and/or polygon(s) to be cut. Generally, determining stitch elements is based on performance (e.g., to keep less corner shape in decomposed masks for FEOL but more corner shapes for BEOL). Coloring conflict areas or polygons also provides color sets. In an embodiment the color relationship between polygons within a color set is identifiable because it is based on a conflict edge that connects a conflict polygon to another conflict polygon. Further, if a conflict polygon is colored with a first index, e.g., "1," the other polygon would be colored with a second index, e.g., "-1." Additionally, each color set can be assigned a flipping index (e.g., 1 or -1), and can be used to check whether a pre-stitch element connects the polygons of the same color index (e.g., same color). In that situation, adjoining conflict polygons or conflict areas separated by the pre-stitch elements are potentially to be merged. When the pre-stitch element connects conflict areas of different colors (e.g., different indices), then the corresponding polygons are potentially to be cut and this pre-stitch element can be used as a stitch element. In fact, all pre-stitch elements can be stitch elements but the amount of polygon cuttings can be huge. Embodiments of the invention merge color sets through stitching elements and use color flipping to minimize the number of polygon cuttings and thus optimize cost.

In one embodiment of the invention, based on the various parameters F calculated from the equation, $$F(f_1, f_2, \ldots f_N) = \frac{1}{2} \sum_{i,j}^{N} f_i f_j A_{ij}$$

determines the parameter F corresponding to a configuration having the optimized stitch elements or the least number of polygons to be cut. Depending on how the merge/cut index MC (below) is defined, a maximum or minimum value of all possible values (e.g., $F_{max}/F_{min}$) is considered.

In the above equation N is the number of color sets, $i <> j$.

$A_{ij} = A_{ji}$, $f_i$ is the flipping index of a color set $A_i$, which is initially set to 1, and changes to -1 after colors corresponding to the color set $A_i$ are flipped, If the MC index $A_{ij}$ is defined as the number M of stitches that should be merged (e.g., potentially be merged) minus the number CT of stitches corresponding to polygons potentially to be cut when $f_i = f_j = 1$, then embodiments determine $F_{max}$ where $$F\text{max} = \text{Max}\left\{ F(f_1, f_2, \ldots f_N) = \frac{1}{2} \sum_{i,j}^{N} f_i f_j A_{ij} \right\}$$

If, however, the MC index $A_{ij}$ is defined as the number of stitches corresponding to polygons potentially to be cut CT minus the number of stitches that can potentially be merged M when $f_i = f_j = 1$, then embodiments determines $F_{min}$ where $$F\text{min} = \text{Min}\left\{ F(f_1, f_2, \ldots f_N) = \frac{1}{2} \sum_{i,j}^{N} f_i f_j A_{ij} \right\}$$

The sum of M and CT is the total number of stitch elements between two color sets. Because matrix solver takes all stitch elements into account in coloring the memory consumption can be very large. Embodiments of the invention simplify the relationship to an index value and thus reduce memory consumption.

$f_i f_j A_{ij}$ may be referred to as a path from color set $A_i$ to color set $A_j$ In the below illustrations, the MC index is defined as the number of stitches that can be merged minus the number of stitches corresponding to polygons to be cut when $f_i = f_j = 1$. As a result, embodiments determine $F_{max}$ to correspond to a color set configuration having the least number of polygons to be cut.

Figure 8:
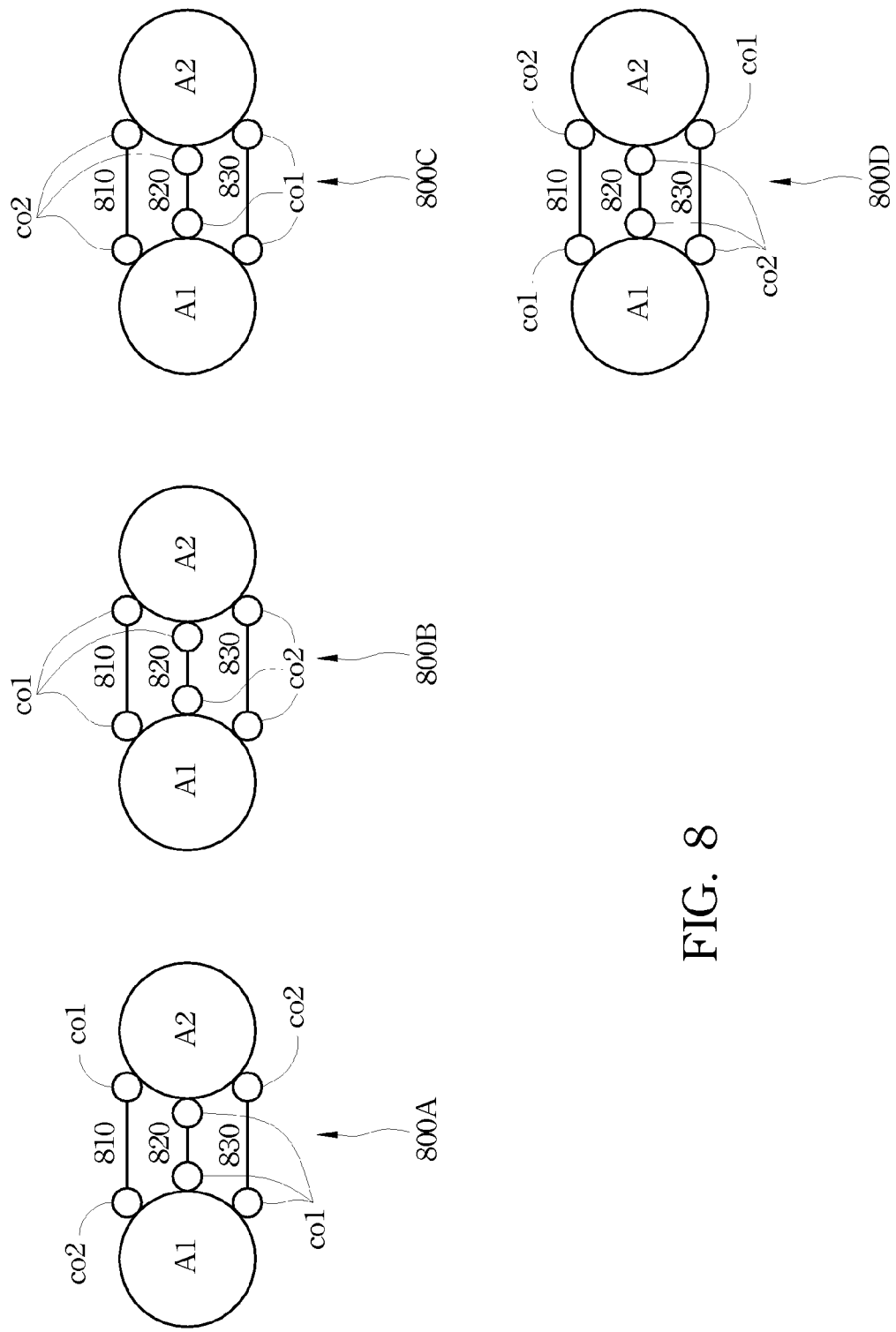
FIG. 8 shows graphs illustrating stitch optimization with two exemplary color sets, in accordance with an embodiment.

FIG. 8 shows graphs 800A-D illustrating minimizing stitch elements with two exemplary color sets, in accordance with an embodiment. Graphs 800A-D include color sets $A_1$ and $A_2$ with three stitch areas represented by lines 810, 820, and 830. Further, based on the two color sets, the four possible values for parameter F represented by $F(f_1, f_2)$ are $F(1,1)$, $F(-1,1)$, $F(1,-1)$ and $F(-1,-1)$. For illustration, based on these two color sets $A_1$ and $A_2$, line 820 in graph 800A connects two polygons of the same color co1, and therefore these polygons are to be merged. Lines 810 and 830 connect two polygons of different colors co1 and co2, and they are therefore to be cut. As a result, the merged number M is 1 and the cut number CT is 2, and $A_{12} = A_{21} = M - CT = 1 - 2 = -1$ Based on the above equation (1)

$$F(f_1, f_2) = F(1,1)$$
$$= \frac{1}{2}((f_1 * f_2 * A_{12}) + (f_1 * f_2 * A_{21}))$$
$$= \frac{1}{2}((1*1*(-1)) + (1*1*(-1)))$$
$$= -1$$

Graph 800B results from graph 800A with colors for color set $A_1$ having been flipped (e.g., color co1 becomes color co2 and color co2 becomes color co1). After flipping, $f_1=-1$; $f_2$ remains to be 1; line 810 connects the same two colors co1 representing polygons to be merged, and line 830 connects the same two colors co2, also representing polygons to be merged. Line 820 connects two different colors, e.g., color co2 for color set $A_1$ and color co1 for color set $A_2$, representing polygons to be cut. As a result, the merged number M is 2 and the cut number CT is 1, and $$F(f_1, f_2) = F(-1,1)$$
$$= \frac{1}{2}((f_1 * f_2 * A_{12}) + (f_1 * f_2 * A_{21}))$$
$$= \frac{1}{2}((-1)*1*(-1)) + (-1)*(1)(-1)) = -1$$

Graph 800C results from graph 800A with colors for color set $A_2$ having been flipped. After flipping, $f_1$ remains to be 1; $f_2=-1$; line 810 connects the same two colors co2 representing polygons to be merged, and line 830 connects the same two colors co1, also representing polygons to be merged. Line 820 connects two different colors co1 for color set $A_1$ and color co2 for color set $A_2$, representing polygons to be cut. As a result, the merged number M is 2 and the cut number CT is 1, and $$F(f_1, f_2) = F(1,-1)$$
$$= \frac{1}{2}((f_1 * f_2 * A_{12}) + (f_1 * f_2 * A_{21}))$$
$$= \frac{1}{2}(1*(-1)*(-1)) + (1*(-1)*(-1)) = 1$$

Graph 800D results from graph 800A with colors for color sets $A_1$ and $A_2$ having been flipped. After flipping, $f_1=-1$, and $f_2=-1$; line 820 connects the same two colors co2 representing polygons to be merged. Line 810 and 830 connect two polygons of different colors co1 and co2, and they are therefore to be cut. As a result, the merged number M is 1 and the cut number CT is 2, and $$F(f_1, f_2) = F(-1,-1)$$
$$= \frac{1}{2}((f_1 * f_2 * A_{12}) + (f_1 * f_2 * A_{21}))$$
$$= \frac{1}{2}((-1)*(-1)*(-1)) + ((-1)*(-1)*(-1)) = -1$$

Based on the four values $F(1,1)=-1$, $F(-1, 1)=1$, $F(1,-1)=1$, and $F(-1, -1)=-1$, because the maximum value is equally the same of 1 for both graphs 800B and 800C, the stitch optimized solution according to embodiments of the invention could be the configuration corresponding to either graph 800B or 800C. In both situations the number of polygon cutting is one (CT=1), instead of two (CT=2) as in graph 800A. In fact, the polygons to be merged or to be cut are the same in graphs 800B and 800C or graphs 800A and 880D.

Figure 9:
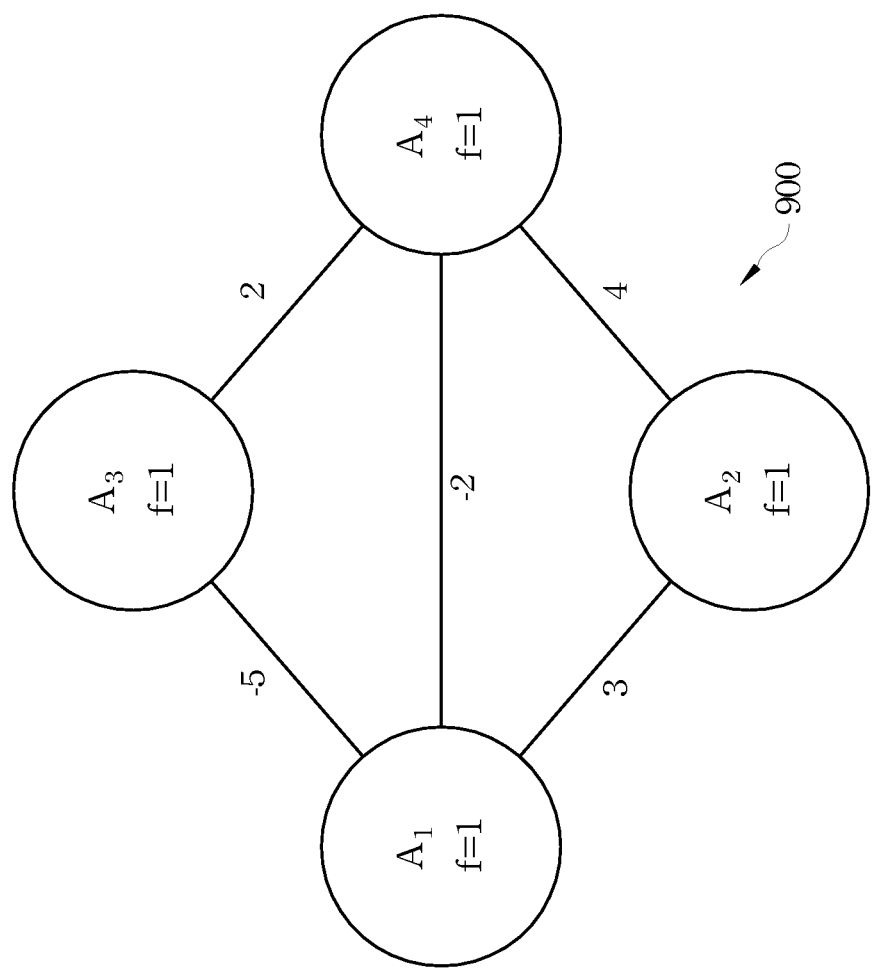
FIG. 9 shows graphs illustrating stitch optimization having exemplary four color sets, in accordance with an embodiment.

FIG. 9 shows graph 900 illustrating stitch optimization having an exemplary four color sets, in accordance with an embodiment of the invention. In this illustration, as shown in graph 900, the four color sets include $A_1$, $A_2$, $A_3$, and $A_4$, and, for illustration purposes, their MC indices $A_{ij}$ are shown as $A_{12}=3$, $A_{13}=-5$, $A_{14}=-2$, $A_{24}=4$, $A_{34}=2$. Further, $A_{23}=A_{32}=0$ because $A_2$ does not have a direct connection with $A_3$. Embodiments of the invention then determine the maximum parameter $F_{max}$ among the various values F of $F(f_1,f_2,f_3,f_4)$ where $$F(f_1, f_2, f_3, f_4) = f_1 f_2 A_{12} + f_1 f_3 A_{13} + f_1 f_4 A_{14} + f_2 f_4 A_{24} + f_3 f_4 A_{34}$$
$$= 3f_1 f_2 + (-5)f_1 f_3 + (-2)f_1 f_4 + 4f_2 f_4 + 2f_3 f_4$$

The total number of possible candidates is 8 and listed as:
F1=F(1,1,1,1), the original configuration as shown in FIG. 9
F2=F(1,1,1,-1), the configuration with colors in color set A4 being flipped
F3=F(1,1,-1,-1), the configuration with colors in color sets A3 and A4 being flipped
F4=F(1,-1,-1,-1), the configuration with color in color sets A2, A3, and A4 being flipped
F5=F(1,-1,1,-1), the configuration with colors in color sets A2 and A4 being flipped
F6=F(1,1,-1,1), the configuration with colors in color set A3 being flipped
F7=F(1,-1,1,1), the configuration with colors in color set A2 being flipped
F8=F(-1,1,1,-1), the configuration with colors in color sets A1 and A4 being flipped
Those skilled in the art will recognize that

F1=F(1,1,1,1)=F(-1,-1,-1,-1)

F2=F(1,1,1,-1)=F(-1,-1,-1,1)

F3=F(1,1,-1,-1)=F(-1,-1,1,1)

F4=F(1,-1,-1,-1)=F(-1,1,1,1)

F5=F(1,-1,1,-1)=F(-1,1,-1,1)

F6=F(1,1,-1,1)=F(-1,-1,1,-1)

F7=F(1,-1,1,1)=F(-1,1,-1,-1)

F8=F(-1,1,1,-1)=F(1,-1,-1,1)

Using the above equation (1)

F1=$A_{12}+A_{13}+A_{14}+A_{24}+A_{34}$=3+(-5)+(-2)+4+2=2

F2=$A_{12}+A_{13}-A_{14}-A_{24}-A_{34}$=3+(-5)-(-2)-4-2=-6

F3=$A_{12}-A_{13}-A_{14}-A_{24}+A_{34}$=3-(-5)-(-2)-4+2=8

F4=$-A_{12}-A_{13}-A_{14}+A_{24}+A_{34}$=-3-(-5)-(-2)+4+2=10

F5=$-A_{12}+A_{13}-A_{14}+A_{24}-A_{34}$=-3+(-5)-(-2)+4-2=-4

F6=$A_{12}-A_{13}+A_{14}+A_{24}-A_{34}$=3-(-5)+(-2)+4-2=8

F7=$-A_{12}+A_{13}+A_{14}-A_{24}+A_{34}$=-3+(-5)+(-2)-4+2=-12

F8=$-A_{12}-A_{13}+A_{14}-A_{24}-A_{34}$=-3-(-5)+(-2)-4-2=-6

Because F4=10 is the maximum value (e.g., $F_{max}$=10), the color set configuration corresponding to F4, in accordance with the first embodiment, is the optimized solution with the least number of polygons to be cut.

Figure 10:
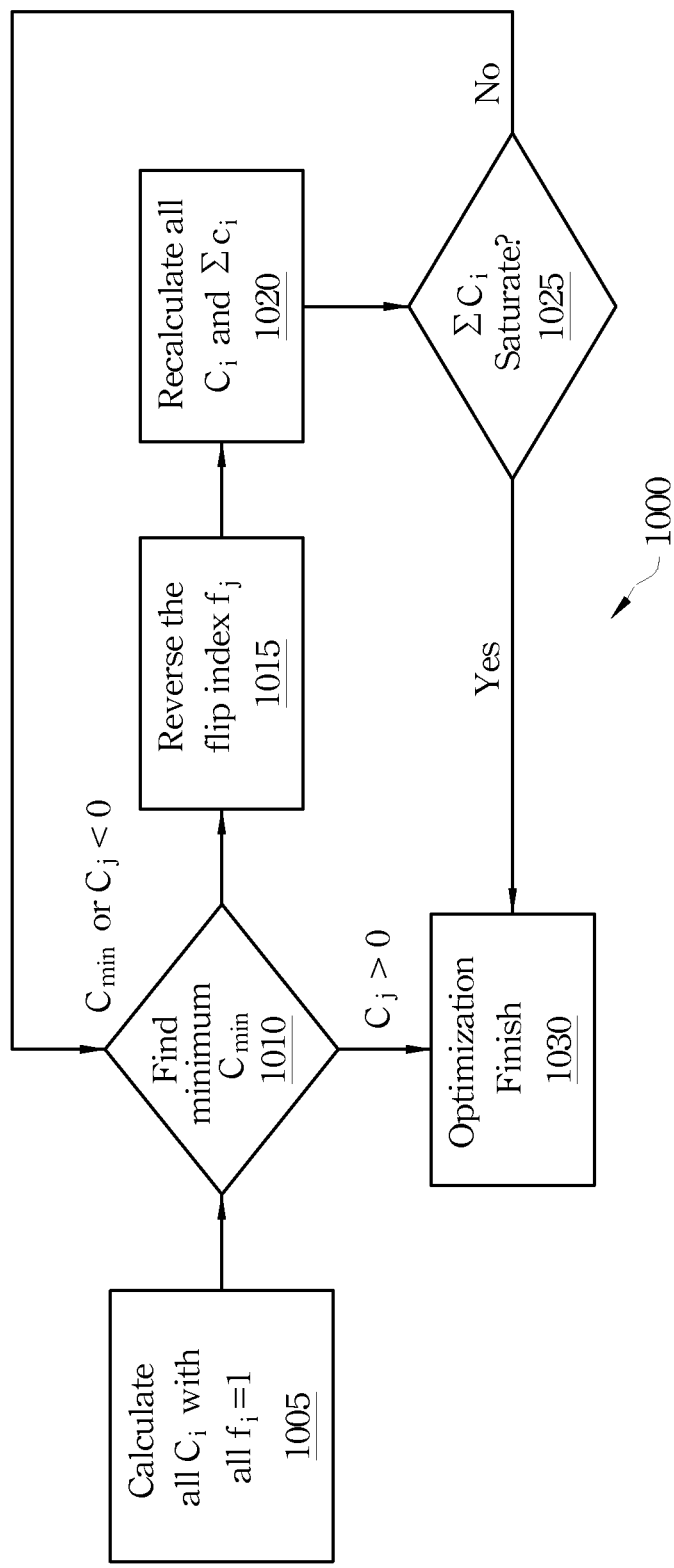
FIG. 10 shows a flowchart illustrating a method to optimize stitch elements or the number of polygons to be cut, in accordance with an embodiment.

FIG. 10 shows a flowchart 1000 illustrating a method to optimize stitch elements or the number of polygons to be cut, in accordance with an embodiment. In this illustration, $$C_i = \sum_j^N f_i f_j A_{ij}$$

for color set $A_i$

In block 1005, all $C_i$ are calculated with all $f_i=f_j=1$.

In block 1010 the minimum $C_{min}$ (=$C_j$) is determined, and if this $C_{min}>=0$ then optimization is complete in block 1030.

If, however, $C_{min}<0$, then the index $f_j$ is reversed in block 1015.

In block 1020, $C_i$ and $\Sigma c_i$ are recalculated.

In block 1025, it is determined if $\Sigma c_i$ is saturated, and if so then optimization is completed in block 1030. If, however, in block 1025, it is determined that $\Sigma c_i$ is not saturated, the method embodiment flows to block 1010 and continues therefrom. $\rho c_i$ is considered saturated when its value does not change anymore after a predetermined number of iterations.

Using the example in FIG. 9, $C_1 = A_{12} + A_{13} + A_{14} = 3 + (-2) + (-5) = -4$ $C_2 = A_{12} + A_{24} = 3 + 4 = 7$ $C_3 = A_{13} + A_{34} = -5 + 2 = -3$ $C_4 = A_{14} + A_{24} + A_{34} = -2 + 2 + 4 = 4$ Alternatively expressing, F(1,1,1,1) results in ($C_1$, $C_2$, $C_3$, $C_4$)=(-4,7,-3,4). Because $C_{min}$ corresponds to $C_1=-4$, which is a negative number, embodiments of the invention flip color set $A_1$ and recalculate F(-1,1,1,1)

$C_1 = -A_{12} - A_{13} - A_{14} = -3 - (-2) - (-5) = 4$ $C_2 = -A_{12} + A_{24} = -3 + 4 = 1$ $C_3 = -A_{13} + A_{34} = -(-5) + 2 = 7$ $C_4 = -A_{14} + A_{24} + A_{34} = -(-2) + 2 + 4 = 8$

Consequently F(-1,1,1,1) results in ($C_1$, $C_2$, $C_3$, $C_4$)=(4,1,7,8)). In this situation, because $C_{min}$ is 1, which is a positive number, stitch optimization is complete.

In various embodiments of the invention a stitch may be assigned a weighting value having a default value 1, and the larger the positive value of the weighting value, the higher preference for the polygons associated with the stitch are to be merged. For a negative weighting value, the larger the absolute value of the weighting value, the higher preference is for the polygons to be cut.

$A_{ij}$ may be defined as $$A_{ij} = \sum_{s=1}^{T} W_s P_{i,s} P_{j,s}$$

where

T is the number of common stitch elements between color set $A_i$ and color set $A_j$ $W_s$ is the weighting value of the s-th stitch element. A weighting value $W_s$ may be assigned based on one or a combination of the stitch shape (e.g., I, L, T shapes, etc.), the location of stitch elements, the symmetrical patterns, the user's defined choices, etc. For example, generally, T and L shaped polygons are preferred to be cut while I shaped polygons are preferred to be merged. Polygons closer to a gate are preferred to be merged, but not cut. When there is a symmetrical pattern and/or symmetrical stitches, if one side is merged, the other side is also preferred to be merged, but if one side is cut the other side is preferred to be cut.

$P_{i,s}$ is the color index of polygon in color set $A_i$ connected with the s-th stitch element when $f_i=f_j=1$.

$P_{j,s}$ is the color index of polygon in color set $A_j$ connected with the s-th stitch element when $f_i=f_j=1$.

In various embodiments, the color index of a polygon, e.g., $P_{i,s}$ and/or $P_{j,s}$ may be represented by 1 or -1. However, the final color of a polygon is determined by color index and flipping index.

If $P_{i,s}=P_{j,s}$ when $f_i=f_j=1$ then the two polygons having the same color are to be merged, but if $P_{i,s} \neq P_{j,s}$ then the two polygons having the different colors are to be cut.

In the example of FIG. 8A, T=3 (represented by three lines 810, 820, and 830). For illustration purposes, $W_1=1$ (line 810), $W_2=10$ (line 820), and $W_3=1$ (line 830). Here, because the weighting $W_2=10$, polygons associated with line 820 are preferred to be merged, as compared to other lines 810 and 830 each having a weighting value of 1. For further illustration, color co2 is 1, and, as a result color co1 is 1, and $P_{1,1}=1$, $P_{1,2}=-1$, and $P_{1,3}=-1$, $P_{2,1}=-1$, $P_{2,2}=-1$, and $P_{2,3}=1$.

Consequently $$A_{ij} = A_{12} = (W_1 * P_{1,1} * P_{2,1}) + (W_2 * P_{1,2} * P_{2,2}) + (W_3 * P_{1,3} * P_{2,3})$$
$$= (1 * 1 * (-1)) + (10 * (-1) * (-1)) + (1 * (-1) * 1)$$
$$= -1 + 10 - 1 = 8$$

$A_{ij}$ then may be used in relevant equations as appropriate.

Depending on applications, stitch elements may be associated with more than 2 color sets (e.g., 3, 4, 5, color sets, etc.), various embodiments of the invention color polygons associated with the least number of color sets first. For example, in some embodiments, color polygons are associated with 2 color sets, then color polygons associated with 3 color sets, then color polygons associated with 4 color sets, etc. During the coloring process, embodiments reduce the number of color sets as appropriate.

Figure 11:
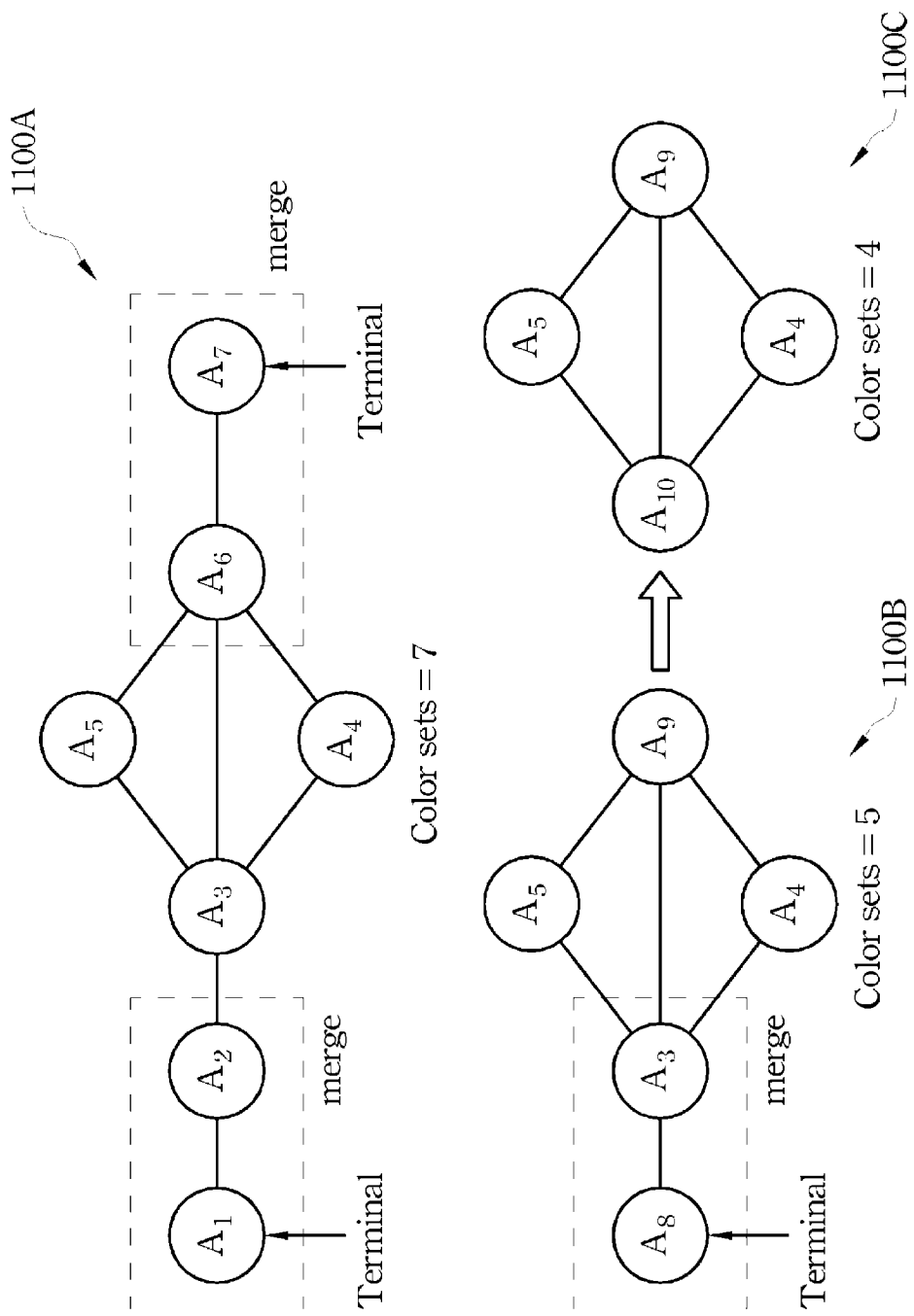
FIG. 11 shows graphs illustrating merging color sets, in accordance with an embodiment.

FIG. 11 shows graphs 1100A, 1100B and 1100C, illustrating merging color sets, in accordance with an embodiment. Generally, merging color sets to reduce/minimize the number of color sets may be used when the number of color sets is large, computing power is limited (e.g., it may take too long for a computer to optimize stitches in accordance with embodiments of the invention, etc.).

Graph 1100A shows exemplary seven color sets $A_1$ to $A_7$. Color sets $A_1$ to $A_7$ are "terminal" color sets because they interact with only one other color set. For example, color set $A_1$ interacts with only color set $A_2$ while color set $A_7$ interacts with only color set $A_6$. Embodiments of the invention merge a terminal color set with the color set interacting with that terminal color set, e.g., merge color set $A_1$ with color set $A_2$, and merge color set $A_7$ with color set $A_6$.

Graph 1100B results from graph 1100A after terminal color set $A_1$ has been merged with color set $A_2$ to become color set $A_8$ and color set $A_7$ has been merged with color set $A_6$ to become color set $A_9$. Based on graph 1100B, the new color set $A_8$ is in fact a terminal color set because it interacts with only one color set $A_3$. In some embodiments of the invention, color set $A_8$ is further merged with color set $A_3$.

Graph 1100C results from graph 1100B after terminal color set $A_8$ has been merged with color set $A_3$ to become color set $A_{10}$ while other color sets $A_4$, $A_5$, and $A_9$ remain unchanged. As compared to graph 1100A that includes 7 color sets, in some embodiments of the invention, the number of color sets is reduced to 5 color sets in graph 1100B and 4 color sets in graph 1100C.

BACKGROUND INFORMATION AND TERMS

Figure 12:
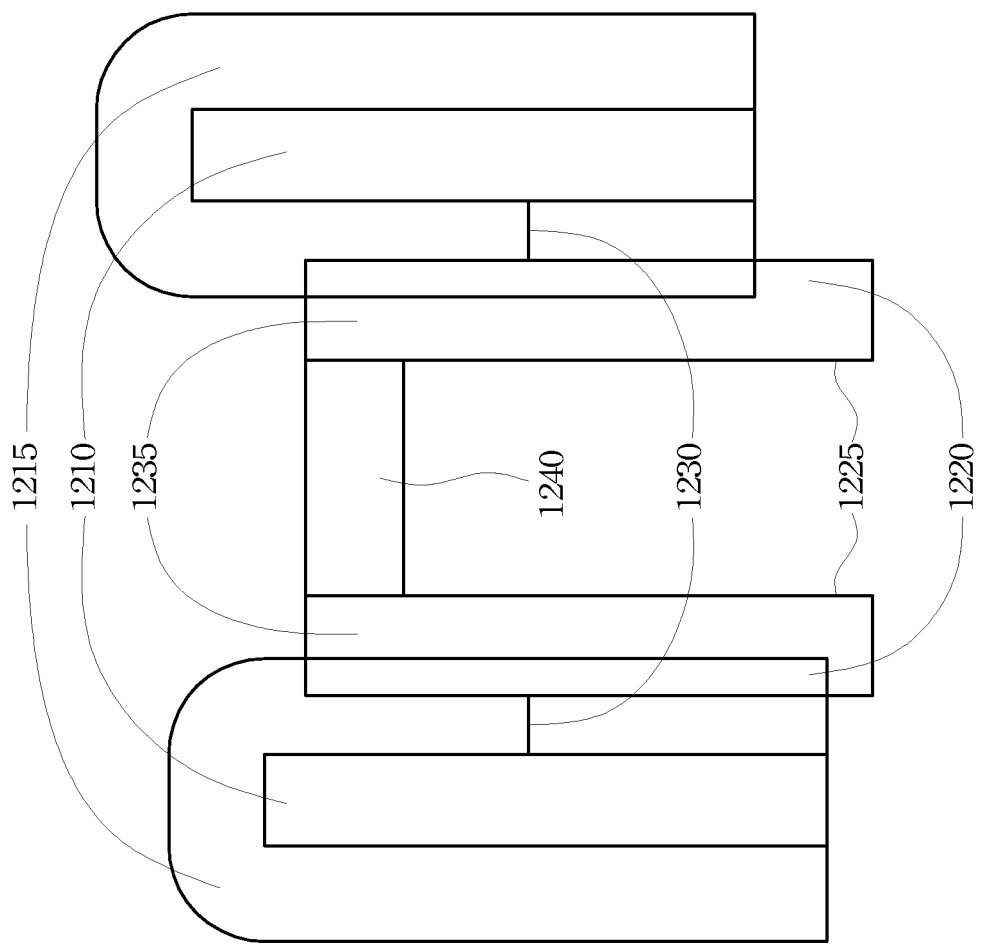
FIG. 12 shows graphs illustrating terms used in this document.

FIG. 12 shows graphs illustrating terms used in this document. As background information for a better understanding of the invention, the following terms and their definitions are used, but they are commonly recognizable and understandable by a person skilled in the art.

Polygon 1210 and 1225: represents a circuit and includes edges and vertices.

Conflict space 1215: a region created nearby polygons' edges and/or vertices to determine conflicts (e.g., space/pitch conflicts).

Conflict area 1220: the overlap between the polygon and the conflict space.

Conflict polygons 1225: polygons that violate the spacing and/or splitting rules (e.g., two polygons that are separated by a space smaller than a predetermined value).

Conflict edge 1230: a segment connecting a pair of conflict polygons or areas.

Connection area 1235: the remainder part of a polygon excluding the conflict area.

Stitch area 1240: an area from the connection area that separates conflict areas. The conflict space, conflict area, connection area and stitch area created by polygon 1220 are not shown in FIG. 12 to not obscure the drawing.

The above method embodiments of the invention may be implemented in software or instructions executed by a computer. These instructions may be stored in and/or carried through one or more computer-readable media, which refers to any medium from which a computer reads information (e.g., a CD-ROM, a DVD-ROM, optical medium, etc.). For example, the instructions may be in the form of executable binary stored in a CD-ROM interfaced with the computer system. The computer system then loads these instructions in RAMs, executes some instructions, and sends some instructions via a communication interface (e.g., a modem) and a telephone line to a network, the Internet, etc., and stores the data in a storage device, e.g., memories, etc. The computer system may also display data (e.g., the conflicting polygons, the conflicting edges, the odd cycles, exemplary polygons to be used/avoided, etc.) on its screen, etc.

A number of embodiments of the invention have been described. It will nevertheless be understood that various modifications may be made without departing from the spirit and scope of the invention. For example, embodiments of the invention can be used in multiple exposure system in which a trim mask is used to form the end-end pattern after double patterning. The Specification above describes method embodiments to determine the least number of polygons to be cut. Generally, the embodiment using the equation (1) is used for a smaller number of color sets, and the embodiment depicted in FIG. 10 is used for a large number of color sets. However, embodiments of the invention are not so limited. Selecting one embodiment over the other embodiment can depend on other factors, including for example the available computing power and/or whether the number of color sets can be reduced (e.g., illustrated FIG. 11). For example, when the computing power is limited, a smaller color sets can still take a long time, the embodiment in flowchart 1000 may be used in that situation. In contrast, if the available computing power is powerful, some embodiments applying equation (1) may still be used for a large number of color sets. Further, the initial number of color set may be large, but it may be reduced and considered as a smaller number of color sets, etc. The above method embodiments show exemplary steps, but these steps are not necessarily required to be performed in the order shown. Steps may be added, replaced, changed order, and/or eliminated as appropriate, in accordance with the spirit and scope of embodiments of the invention.

In accordance with an embodiment, a method includes determining one or more potential merges corresponding to a color set $A_i$ and a color set $A_j$ of N color sets, represented by $A_1$ to $A_N$, used in coloring polygons of a layout of an integrated circuit. N is a positive integer, i and j are integers from 1 to N, and i≠j. One or more potential cuts corresponding to the color set $A_i$ and the second color set $A_j$ are determined. An index $A_{ij}$ is determined according to the one or more potential merges and the one or more potential cuts, where $A_{ij}=A_{ji}$. A plurality of parameters F related to the index $A_{ij}$ is obtained based on various values of indices $f_i$ and $f_j$. A parameter F is selected among the plurality of parameters F based on a definition of the index $A_{ij}$.

In accordance with another embodiment, a method includes determining one or more potential merges corresponding to a color set $A_i$ and a color set $A_j$ of N color sets, represented by $A_1$ to $A_N$, used in coloring polygons of a layout of an integrated circuit. N is a positive integer, i and j are integers from 1 to N, and i≠j. One or more potential cuts corresponding to the color set $A_i$ and the second color set $A_j$ are determined. An index $A_{ij}$ is determined according to the one or more potential merges and the one or more potential cuts, where $A_{ij}=A_{ji}$. Based on the equation $$C_i = \sum_{j}^{N} f_i f_j A_{ij},$$

for the color set $A_i$, a plurality of $C_i$ is calculated. Index $f_i$ corresponds to the color set $A_i$, and index $f_j$ corresponds to the color set $A_j$. Based on the plurality of $C_1$, a color set configuration is determined corresponding to a least number of polygons to be cut.

In accordance with another embodiment, a method includes determining one or more potential merges between two sets of polygons of a layout. Polygons of the two sets of polygons have corresponding coloring assignments, and each of the two sets of polygons is associated with a corresponding flipping index indicating if the corresponding coloring assignment is color-flipped. One or more potential cuts between the two sets of polygons are determined. An index is determined according to the one or more potential merges and the one or more potential cuts. A plurality of parameters is calculated based on the index and various values of flipping indices of the two sets of polygons. One of the plurality of parameters having the maximum value or the minimum value of the plurality of parameters is selected. The two sets of polygons are merged according to the coloring assignments of the two sets of polygons and the values of the flipping indices of the two sets of polygons corresponding to the selected one of the plurality of parameters.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed:

1. A method comprising:
   determining one or more potential merges corresponding to a color set $A_i$ and a color set $A_j$ of N color sets, represented by $A_1$ to $A_N$, used in coloring polygons of a layout of an integrated circuit, N being a positive integer, i and j being integers from 1 to N, and i≠j;
   determining one or more potential cuts corresponding to the color set $A_i$ and the second color set $A_j$;
   determining an index $A_{ij}$ according to the one or more potential merges and the one or more potential cuts, where $A_{ij}=A_{ji}$;
   obtaining, by a computer, a plurality of parameters F related to the index $A_{ij}$ based on various values of indices $f_i$ and $f_j$; and
   selecting a parameter F among the plurality of parameters F based on a definition of the index $A_{ij}$.

2. The method of claim 1, wherein the index $f_i$ includes a value of 1 or −1.

3. The method of claim 1, wherein selecting the parameter F among the plurality of parameters F having a highest value if the index $A_{ij}$ is defined as a number of the one or more potential merges M minus a number of the one or more potential cuts CT, and selecting the parameter F among the plurality of parameters F having a lowest value if the index $A_{ij}$ is defined as the number of the one or more potential cuts CT minus the number of the one or more potential merges M.

4. The method of claim 3, wherein the number of the one or more potential merges M and the number of the one or more potential cuts CT corresponding to the color set $A_i$ and the color set $A_j$ are determined when $f_i$ and $f_j$ are assigned 1.

5. The method of claim 1, wherein obtaining the plurality of parameters $$F(f_1, f_2, \ldots f_N) = \frac{1}{2}\sum_{i,j}^{N} f_i f_j A_{ij}$$

F is based on the equation.

6. The method of claim 1, further merging a terminal color set to a color set that interacts with the terminal color set.

7. The method of claim 1, wherein the index $A_{ij}$ includes a weighting value based on one or a combination of a stitch shape, a location of stitch elements, a symmetrical pattern, or a user's defined choice.

8. The method of claim 1, wherein the index $A_{ij}$ is represented by $$A_{ij} = \sum_{s=1}^{T} W_s P_{i,s} P_{j,s}$$

where
   T is a number of common stitch elements between the color set $A_i$ and the color set $A_j$;
   $W_s$ is a weighting value of an s-th stitch element;
   $P_{i,s}$ is a color index of polygon in the color set $A_i$ connected with the s-th stitch element; and
   $P_{j,s}$ is a color index of polygon in the color set $A_j$ connected with the s-th stitch element.

9. A method comprising:
   determining one or more potential merges corresponding to a color set $A_i$ and a color set $A_j$ of N color sets, represented by $A_1$ to $A_N$, used in coloring polygons of a layout of an integrated circuit, N being a positive integer, i and j being integers from 1 to N, and i≠j;
   determining one or more potential cuts corresponding to the color set $A_i$ and the second color set $A_j$;
   determining an index $A_{ij}$ according to the one or more potential merges and the one or more potential cuts, where $A_{ij}=A_{ji}$;
   based on the equation $$C_i = \sum_{j}^{N} f_i f_j A_{ij}$$

for the color set $A_i$, calculating, by a computer, a plurality of $C_i$, wherein index $f_i$ corresponds to the color set $A_i$, and index $f_j$ corresponds to the color set $A_j$; and
   based on the plurality of $C_i$, determining a color set configuration corresponding to a least number of polygons to be cut.

10. The method of claim 9, further comprising:
    determining a $C_j$ among the plurality of $C_i$ having a lowest value;
    if $C_j<0$, then flipping an index $f_j$ to a negative number; and recalculating $$C_i = \sum_{j}^{N} f_i f_j A_{ij}.$$

11. The method of claim 10, wherein the positive number is equal to 1 and the negative number is equal to −1.

12. The method of claim 9, further comprising merging a terminal color set to color set interacting with the terminal color set.

13. The method of claim 9, wherein the index $A_{ij}$ includes a weighting value based on one or a combination of a stitch shape, a location of stitch elements, a symmetrical pattern, a user's defined choice.

14. The method of claim 13, wherein the index $A_{ij}$ is represented by $$A_{ij} = \sum_{s=1}^{T} W_s P_{i,s} P_{j,s}$$

where
   T is a number of common stitch elements between the color set $A_i$ and the color set $A_j$;
   $W_s$ is a weighting value of an s-th stitch element;
   $P_{i,s}$ is a color index of polygon in the color set $A_i$ connected with the s-th stitch element; and
   $P_{j,s}$ is a color index of polygon in the color set $A_j$ connected with the s-th stitch element.

15. The method of claim 9, wherein the index $A_{ij}$ is determined according to a difference between a number of the one or more potential merges and a number of the one or more potential cuts corresponding to the color set $A_i$ and a color set $A_j$ that are determined when $f_i$ and $f_j$ are assigned 1.

16. A method comprising:
    determining one or more potential merges between two sets of polygons of a layout, polygons of the two sets of polygons having corresponding coloring assignments, and each of the two sets of polygons being associated with a corresponding flipping index indicating if the corresponding coloring assignment is color-flipped;

determining one or more potential cuts between the two sets of polygons;

determining an index according to the one or more potential merges and the one or more potential cuts;

calculating, by a computer, a plurality of parameters based on the index and various values of flipping indices of the two sets of polygons;

selecting one of the plurality of parameters having the maximum value or the minimum value of the plurality of parameters; and merging the two sets of polygons according to the coloring assignments of the two sets of polygons and the values of the flipping indices of the two sets of polygons corresponding to the selected one of the plurality of parameters.

17. The method of claim 16, wherein at least one of the flipping indices of the two sets of polygons has a positive value indicating using the corresponding coloring assignment during the merging operation, or a negative value indicating using a color-flipped version of the corresponding coloring assignment during the merging operation.

18. The method of claim 17, wherein the positive value is 1, and the negative value is −1.

19. The method of claim 16, wherein the index is determined according to a difference between a number of the one or more potential merges and a number of the one or more potential cuts corresponding to the two sets of polygons that are determined when the two sets of polygons are merged using the coloring assignments.

20. The method of claim 16, wherein the determining the index includes calculating an stitch index based on a weighting value, and the weighting value is determined based on one or a combination of a stitch shape, a location of stitch elements, a symmetrical pattern, or a user's defined choice.

* * * * *